United States Patent
Op Het Veld et al.

(10) Patent No.: US 12,041,857 B2
(45) Date of Patent: Jul. 16, 2024

(54) METHOD OF FABRICATING GATES

(71) Applicant: Microsoft Technology Licensing, LLC, Redmond, WA (US)

(72) Inventors: Roy Leonardus Maria Op Het Veld, Eindhoven (NL); Jason Petros Heinrich Jung, Eindhoven (NL); Petrus Johannes Van Veldhoven, Eindhoven (NL)

(73) Assignee: Microsoft Technology Licensing, LLC, Redmond, WA (US)

( * ) Notice: Subject to any disclaimer, the term of this patent is extended or adjusted under 35 U.S.C. 154(b) by 82 days.

(21) Appl. No.: 17/906,427

(22) PCT Filed: Mar. 30, 2020

(86) PCT No.: PCT/EP2020/059002
§ 371 (c)(1),
(2) Date: Sep. 15, 2022

(87) PCT Pub. No.: WO2021/197573
PCT Pub. Date: Oct. 7, 2021

(65) Prior Publication Data
US 2023/0142402 A1    May 11, 2023

(51) Int. Cl.
*H10N 60/01* (2023.01)
*H03K 17/92* (2006.01)
(Continued)

(52) U.S. Cl.
CPC ............ *H10N 60/01* (2023.02); *H03K 17/92* (2013.01); *H10N 60/10* (2023.02); *B82Y 10/00* (2013.01);
(Continued)

(58) Field of Classification Search
CPC ..................................................... H10N 60/01
(Continued)

(56) References Cited

U.S. PATENT DOCUMENTS

2020/0027919 A1* 1/2020 Van Hoogdalem ..... C23C 14/28

FOREIGN PATENT DOCUMENTS

| EP | 3505490 A1 | 7/2019 |
| KR | 950007139 A | 3/1995 |

OTHER PUBLICATIONS

"International Search Report and Written Opinion Issued in PCT Application No. PCT/EP20/059002", dated Dec. 8, 2020, 14 Pages.
(Continued)

*Primary Examiner* — Tomi Skibinski
(74) *Attorney, Agent, or Firm* — Alleman Hall & Tuttle LLP

(57) ABSTRACT

A method of fabricating semiconductor-superconductor nanowires, comprising: forming a first mask amorphous mask having first openings over trenches in a substrate; forming a monocrystalline conducting material in the first openings by selective area growth, thus forming gates for the nanowires in the trenches pf the substrate; forming a second mask over the substrate and gates, the second mask also being amorphous and having a pattern of second openings; forming an insulating crystalline buffer in the second openings; forming a crystalline semiconductor material on the buffer in the second openings by selective area growth in order to form the cores of the nanowires, wherein the gates intersect with the cores in the plane of the substrate; and forming the coating of superconductor material over at least part of each of the cores.

20 Claims, 4 Drawing Sheets

(51) Int. Cl.
*H10N 60/10* (2023.01)
*B82Y 10/00* (2011.01)
*B82Y 40/00* (2011.01)
*G06N 10/80* (2022.01)
*H10N 60/83* (2023.01)

(52) U.S. Cl.
CPC .............. *B82Y 40/00* (2013.01); *G06N 10/80* (2022.01); *H10N 60/83* (2023.02)

(58) Field of Classification Search
USPC ......................................................... 427/62
See application file for complete search history.

(56) References Cited

OTHER PUBLICATIONS

U.S. Appl. No. 12/579,183, filed Oct. 14, 2009.
U.S. Appl. No. 12/556,440, filed Sep. 9, 2009.
U.S. Appl. No. 12/562,940, filed Sep. 18, 2009.
U.S. Appl. No. 14/668,300, filed Mar. 25, 2015.
U.S. Appl. No. 13/321,807, filed Jun. 18, 2010.
U.S. Appl. No. 12/329,517, filed Dec. 5, 2008.
U.S. Appl. No. 12/136,645, filed Jun. 10, 2008.
U.S. Appl. No. 10/829,668, filed Oct. 31, 2002.
U.S. Appl. No. 10/962,295, filed Apr. 8, 2003.
U.S. Appl. No. 12/166,491, filed Jul. 2, 2008.
U.S. Appl. No. 60/948,122, filed Jul. 5, 2007.
U.S. Appl. No. 12/166,439, filed Jul. 2, 2008.
U.S. Appl. No. 60/948,120, filed Jul. 5, 2007.
U.S. Appl. No. 17/382,174, filed Jul. 21, 2021.
U.S. Appl. No. 16/484,088, filed Oct. 26, 2018.
U.S. Appl. No. 17/018,972, filed Sep. 11, 2020.
U.S. Appl. No. 16/252,230, filed Jan. 18, 2019.
U.S. Appl. No. 17/332,908, filed May 27, 2021.
U.S. Appl. No. 16/258,025, filed Jan. 25, 2019.
U.S. Appl. No. 17/429,300, filed Feb. 15, 2019.
U.S. Appl. No. 17/597,837, filed Jul. 29, 2019.
U.S. Appl. No. 17/753,581, filed Sep. 10, 2019.
U.S. Appl. No. 17/756,036, filed Nov. 15, 2019.
U.S. Appl. No. 17/756,812, filed Dec. 5, 2019.
U.S. Appl. No. 17/907,530, filed Mar. 31, 2020.
U.S. Appl. No. 17/996,369, filed Apr. 22, 2020.
U.S. Appl. No. 17/996,442, filed Apr. 29, 2020.
Office Action Received for Japanese Application No. 2022-557674, mailed on May 7, 2024, 7 pages.
Office Action Received for Korean Application No. 10-2022-7031987, mailed on May 13, 2024, 14 pages.

* cited by examiner

METHOD OF FABRICATING GATES

CROSS REFERENCE TO RELATED APPLICATIONS

The present application is a U.S. National Phase of International Patent Application Serial No. PCT/EP2020/059002 entitled "METHOD OF FABRICATING GATES", filed Mar. 30, 2020.

BACKGROUND

Topological quantum computing is based on the phenomenon whereby non-abelian anyons, in the form of "Majorana zero modes" (MZMs), can be formed in regions where a semiconductor is coupled to a superconductor. A non-abelian anyon is a type of quasiparticle, meaning not a particle per se, but an excitation in an electron liquid that behaves at least partially like a particle. An MZM is a particular bound state of such quasiparticles. Under certain conditions, these states can be formed close to the semiconductor-superconductor interface in a nanowire formed from a length of semiconductor coated with a superconductor. When MZMs are induced in the nanowire, it is said to be in the "topological regime". To induce this requires a magnetic field, conventionally applied externally, and also cooling of the nanowire to a temperature that induces superconducting behaviour in the superconductor material. It may also involve gating a part of the nanowire with an electrostatic potential.

By forming a network of such nanowires and inducing the topological regime in parts of the network, it is possible to create a quantum bit (qubit) which can be manipulated for the purpose of quantum computing. A quantum bit, or qubit, is an element upon which a measurement with two possible outcomes can be performed, but which at any given time (when not being measured) can in fact be in a quantum superposition of the two states corresponding to the different outcomes.

To induce a MZM the device is cooled to a temperature where the superconductor (e.g. Aluminium, Al) exhibits superconducting behaviour. The superconductor causes a proximity effect in the adjacent semiconductor, whereby a region of the semiconductor near the interface with the superconductor also exhibits superconducting properties. I.e. a topological phase behaviour is induced in the adjacent semiconductor as well as the superconductor. It is in this region of the semiconductor where the MZMs are formed.

Another condition for inducing the topological phase where MZMs can form is the application of a magnetic field in order to lift the spin degeneracy in the semiconductor. Degeneracy in the context of a quantum system refers to the case where different quantum states have the same energy level. Lifting the degeneracy means causing such states to adopt different energy levels. Spin degeneracy refers to the case where different spin states have the same energy level. Spin degeneracy can be lifted by means of a magnetic field, causing an energy level spilt between the differently spin-polarized electrons. This is known as the Zeeman effect. Typically the magnetic field is applied by an external electromagnet. However it is also possible to use a layer ferromagnetic insulator disposed between the superconductor and semiconductor in order to internally apply the magnetic field for lifting the spin degeneracy, without the need for an external magnet.

Inducing MZMs also involves gating the nanowire with an electrostatic potential to control the carrier density in the nanowire. The terminals for applying this potential are referred to as the gates.

Structures such as the semiconductor cores of a network of nanowires can be formed on a substrate by means of a process known as selective area growth (SAG), which refers to selective epitaxial growth through an amorphous mask. Epitaxy is a known deposition technique that comprises growing one crystalline material on another crystalline material. The first material acts as a seed crystal for the second material being grown on the first. The growth is performed selectively by forming a patterned mask over a layer of the first material (e.g. a crystalline substrate) and growing the deposited material (e.g. the semiconductor of the nanowires) in the regions left exposed by the mask. Because the mask is amorphous the deposed material does not grow on the mask but only in the openings where the underlying crystalline substrate is exposed. Example techniques for the epitaxial deposition itself include, for example, electron-beam physical vapour deposition, plasma-enhanced chemical vapour deposition, or atomic layer deposition, and molecular beam epitaxy.

The gates can be formed as top gates or bottom gates. In the case of top gates, these are formed from a patterned layer of metal formed over the semiconductor of the nanowires. In such an arrangement, the semiconductor cores of the nanowires can be grown "in plane" (i.e. horizontally on the substrate of the device itself) by means of selective area growth (SAG). However, a downside to top gates is that additional chemical processing steps have to be applied on top of the semiconductor of the nanowire, after formation of the semiconductor, in order to pattern the gate material to form the individual gates. Such processing steps can damage the nanowires. E.g. the processing steps may involve depositing and removing a resist, which could damage the surface of the underlying semiconductor when removed, or could leave a residue of the resist. Such damage can affect the ability to induce MZMs in the nanowires Also, with top-gates, the superconducting metal coating of the nanowire shields the semiconductor from the gates to some extent, reducing their effectiveness.

Bottom gates avoid these issues. In the existing method of fabricating a device with bottom gates, metal gates are formed in the substrate of the device being fabricated. The nanowires have to be grown separately in a vertical orientation, and then "felled" and transferred to the device, so as to lie flat over the gates in the plane of the substrate. These are known as "out-of-plane" nanowires, in that they are grown away from the plane of the substrate of the device being fabricated, as opposed to in-plane nanowires which are grown in place over the plane of the substrate.

SUMMARY

In the existing method of fabricating a device with bottom gates, the semiconductor of the nanowire cannot be grown over the substrate itself because the metals conventionally used to form gates are conventionally deposited by evaporation or sputtering and are polycrystalline when deposited in this manner. If an in-plane nanowire was grown on such a surface then this would lead to defects in the wire. Hence the nanowires have to be grown separately and then transferred to the substrate. However, there is an issue with this out-of-plane approach, in that this method of forming nanowires is not scalable to large or complex networks of nanowires. To address this or other issues, it would be desirable to provide an alternative method of forming a device with bottom gates.

According to one aspect disclosed herein, there is provided a method of fabricating a device comprising a plurality of semiconductor-superconductor nanowires, each comprising a respective semiconductor core and a coating of superconductor material over the respective core. The method comprises: forming a first mask over a substrate, the substrate defining a plane, wherein the first mask is formed from an amorphous material and has a pattern of first openings formed over trenches in the substrate, and the substrate comprises a crystalline material at least at a surface of the trenches; and forming a monocrystalline conducting material in the first openings by selective area growth, in order to thereby form gates for the nanowires in the trenches of the substrate. The method further comprises: forming a second mask over the substrate and gates, the second mask also being amorphous and having a pattern of second openings; forming an insulating crystalline buffer in the second openings; and forming a crystalline semiconductor material on the buffer in the second openings by selective area growth in order to form the cores of the nanowires, wherein the gates intersect with the cores in the plane of the substrate; and forming the coating of superconductor material over at least part of each of the cores.

By embedding the gates in the substrate and forming them of a monocrystalline material by selective area growth, this enables the growth of in-plane nanowires over bottom gates.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Nor is the claimed subject matter limited to implementations that solve any or all of the disadvantages noted herein.

BRIEF DESCRIPTION OF THE DRAWINGS

To assist understanding of embodiments of the present disclosure and to show how such embodiments may be put into effect, reference is made, by way of example only, to the accompanying drawings in which.

DETAILED DESCRIPTION OF EMBODIMENTS

Figure 1:
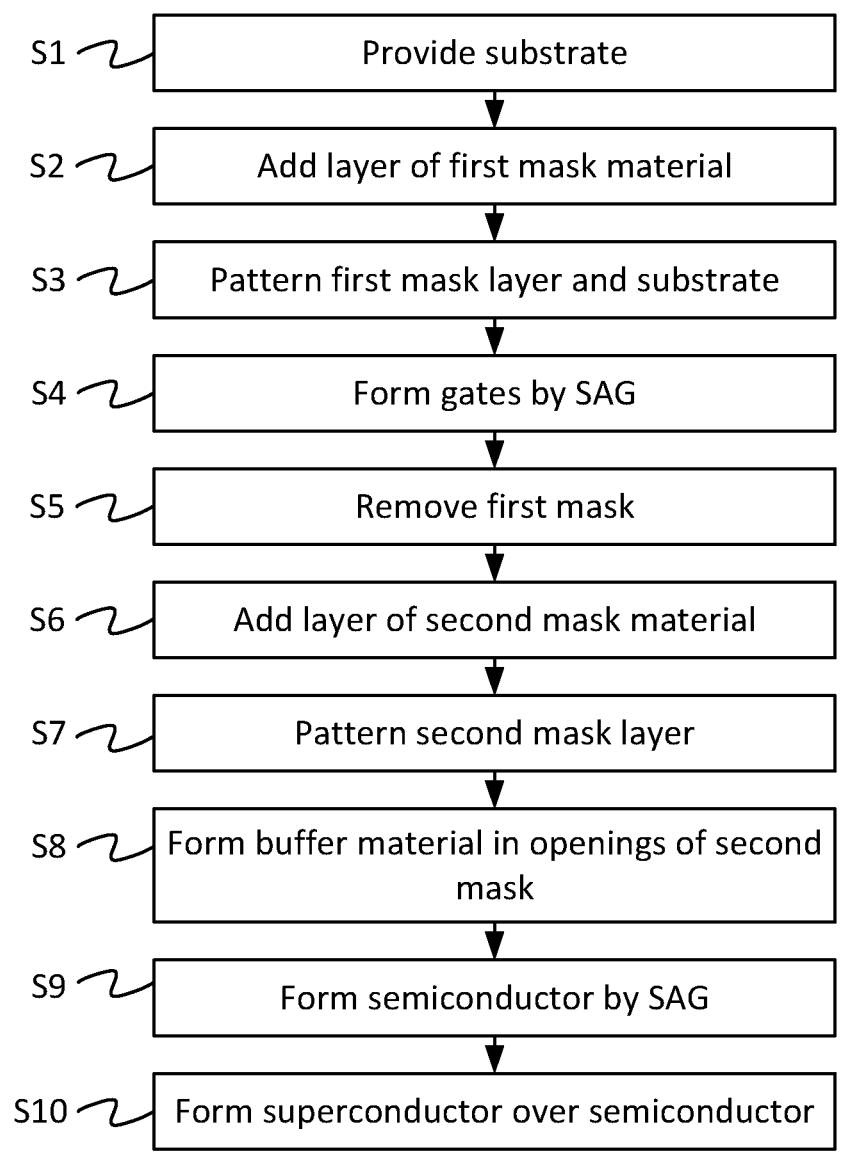
FIG. 1 is a flow chart showing a method of fabricating a device according to exemplary embodiments disclosed herein, FIGS. 2A-B give schematic side views of the device at various stages in the fabrication method of FIG. 1, FIG. 3 schematically illustrates layers of a device formed according to the method of FIGS. 1 and 2A-B.

The present disclosure provides an arrangement of selective area grown bottom gates (e.g. "finger" gates) for gating a network of in-plane nanowires.

As mentioned, two existing gate types can be distinguished: top gates and bottom gates. The common method in the case of in-plane wires is to fabricate gates on top of the nanowire, i.e. top gates. This type of gate has at least two drawbacks. Firstly, it adds additional processing steps after the nanowire growth, which can contaminate and potentially damage the nanowire surface, giving rise to scattering sites. This is particularly problematic for quantum applications, as these scattering sites negatively affect carrier mobility and the coherence length of devices.

Further, material platforms towards topological quantum computing work with semiconducting-superconducting hybrid heterostructures. In the case of in-plane growth, the superconductor is deposited on top of the nanowire. This shields the effect of top gates and makes them less effective.

These issues can be avoided if the gates are fabricated prior to the nanowire epitaxy. Such gates are also known as bottom gates. Bottom gates are conventionally only used when working with out-of-plane nanowires, where the wires are grown separately and then transferred to pre-patterned substrates containing the bottom "finger" gate structures. However the out-of-plane method is not scalable to large or complex networks of nanowires. Also it is very difficult to grow large structures, and furthermore the probability of successfully producing a given structure decreases exponentially with the number of wires.

It is not possible to grow in-plane wires on top of existing substrates containing bottom gates, given that the gate metal and dielectric are generally amorphous. This severely limits the quality of any subsequent growth.

Note that the gate material has to be patterned in order to form individual gates for selectively controlling individual nanowires in a network, or even individual sections of a given nanowire. I.e. a patterned gate structure is required in order to allow one to select where to gate and where not (where to apply the desired electrostatic potential). A global back gate (i.e. one large uniform back gate) would only allow for non-local tuning of the overall chemical potential, and not for gating an individual nanowire as would be required to operate it as a nanowire in a quantum computing device.

It would be desirable to enable the fabrication of in-plane semiconductor nanowires through selective area epitaxy. This scalable approach will allow for the growth of complex networks while keeping the advantage of the nanowire geometry, i.e. quasi one-dimensionality. Gate electrodes are traditionally used to control the carrier density in these nanowires during transport measurements, e.g. to induce a tunnel barrier or to manipulate the chemical potential of a wire. As mentioned, these gate structures are typically fabricated subsequently to the nanowire epitaxy and require chemical processing. This can leave residuals or damage the nanowire surface and lead to deterioration of the material quality.

The presently disclosed method realizes a structure of local bottom gates (e.g. "finger" gates) through selective area epitaxy. This maintains the crystal structure of the substrate in the gate and semi-insulating material and therefore allows the subsequent growth of nanowire networks on top of the gates.

As mentioned, it is not possible to grow in-plane wires on top of conventional substrates containing bottom gates, since the gate metal and dielectric are generally amorphous. Therefore according to the present disclosure, the gate material and the substrate (e.g. a dielectric) are instead crystalline. Selective area growth is used to form a network of patterned bottom gates (e.g. finger gates), over which the nanowires can then be formed. This combines the flexibility of selective area growth with the precision of local gates. Furthermore, many more advanced applications require a large number of gates, in which case it will be necessary to have the option to also gate from underneath the networks. Selective area grown finger gates are therefore a good option to maintain high material quality using finger gates to control the carrier density of in-plane nanowire networks.

Enabling effective gating of the nanowire below the superconductor is significant for tunability towards topological phases.

One material option for the gate is degenerately doped InGaAs which is lattice matched to InP, a common substrate material used for in-plane InSb and InAs growth. There are several options for the crystalline semi-insulating layer, with the preferred choice depending on the crystal structure of the subsequent nanowire material. Two viable options are InP or InAlSb.

Figure 2A:
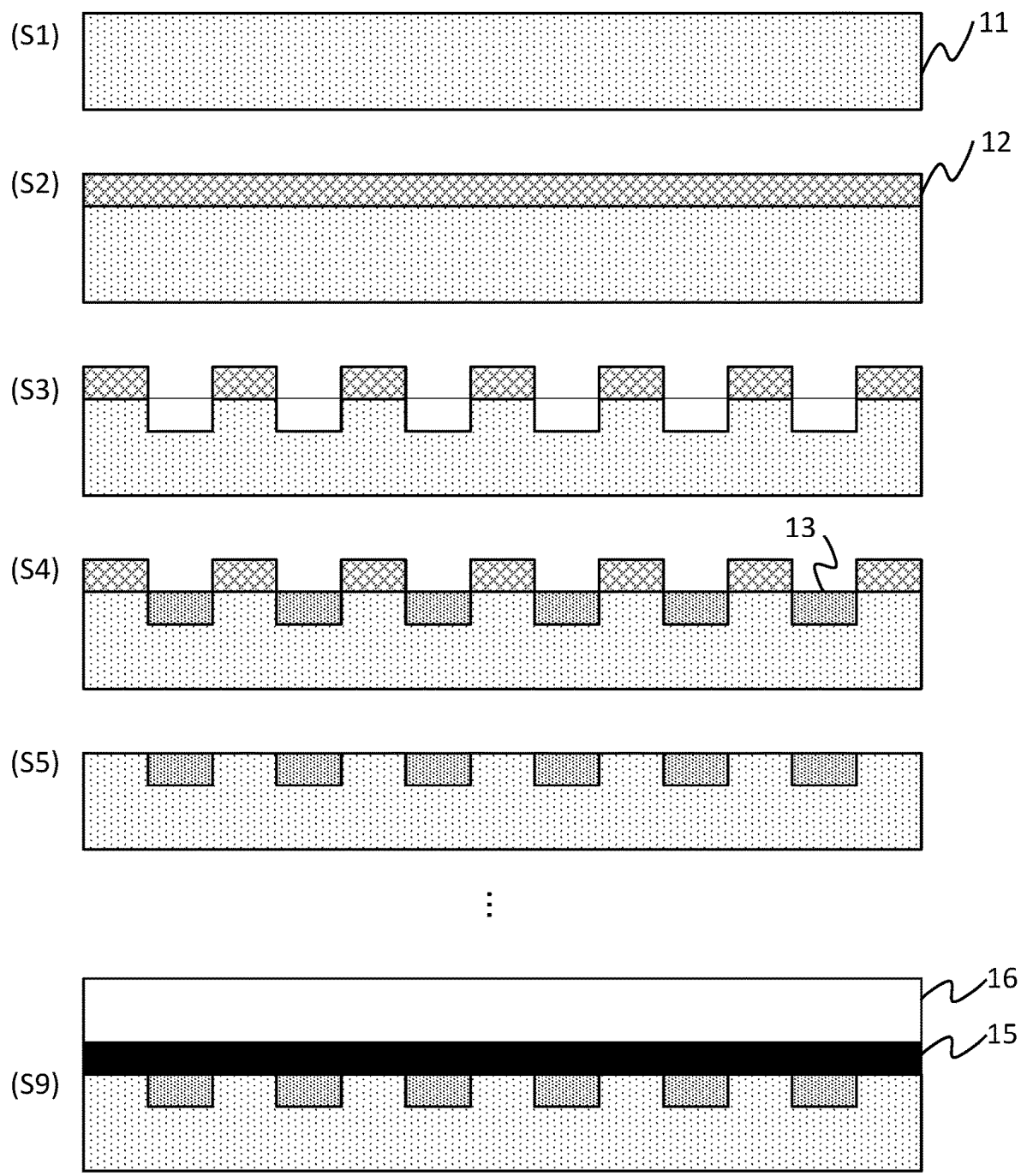
Figure 2B:
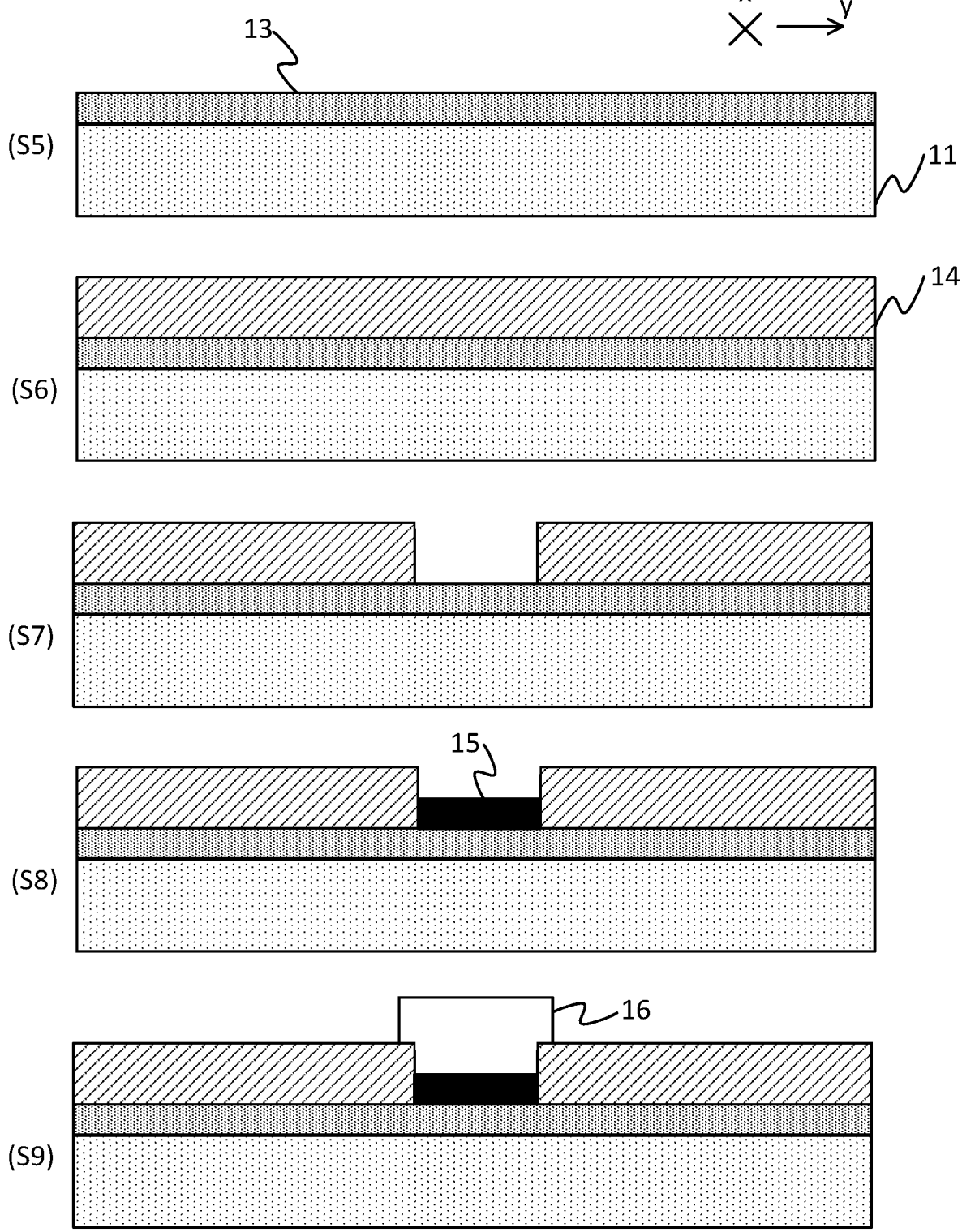
Figure 3:
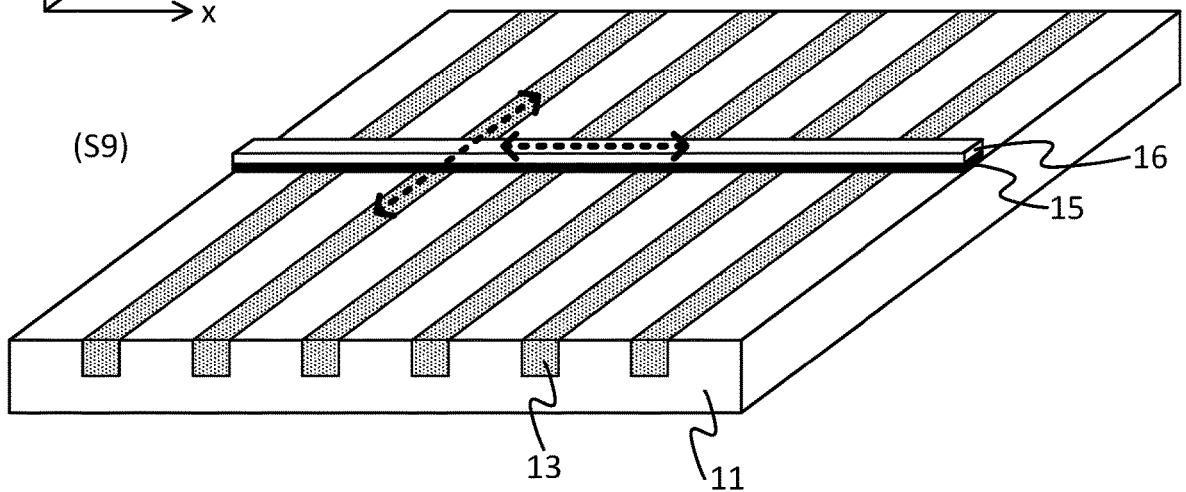

FIG. 1 is a flow chart of a method according to exemplary embodiments of the present disclosure. FIG. 2A shows a side view of the device being fabricated during various stages of the method, with an x direction shown left-to-right (horizontal in the plane of the page) and a y direction shown into the page (perpendicular to the page). FIG. 2B shows a side view of the device being fabricated during further stages of the method, with the y direction shown left-to-right in the plane of the page and the x direction shown into the page. FIG. 3 shows a corresponding isometric view of various of the layers shown in FIGS. 2A and 2B. The x and y axes are in the plane of the substrate 11.

The device to be fabricated will comprise: a substrate 11, gates 13, a buffer 15, the semiconductor cores 16 of the nanowires, and the superconducting coating 17 over part or all of each semiconductor core 16. It will be appreciated that the orientation of the x-y axes relative to the plane of the substrate 11 may depend on design. Also the straight-line designs shown herein are only given by way of example. It is not essential that the gates 13 or nanowires 16/17 form straight lines, nor that the gates 13 are necessarily perpendicular to the nanowires 16/17.

On a point of terminology, "over" herein may mean either formed directly on, or indirectly over with any one or more intermediate layers in between. "On" herein means directly on, i.e. in contact with, without any intermediate layer. Note also that the terms "on" or "over" or such like, as used herein, do not necessarily imply a particular orientation relative to gravity (in some growth chambers the device could be fabricated upside down compared to the orientation shown in the figures). Rather, they refer to the position relative to the side of the substrate 11 being worked, i.e. the positive z direction facing outward from the side of the substrate 11 being worked. Converse interpretation should be given to terms such as "under" or "below", etc.

Step S1 comprises providing the substrate 11. The substrate 11 may comprise one or more constituent layers. It is preferably a dielectric or other insulator, or at least has a substantially greater band gap (i.e. is more insulating) than the semiconductor material 16 that will be used for the nanowire cores. The substrate 11 comprises a crystalline material (at least where the gates 13 are to be formed), e.g. InP (Indium Phosphide). InP is a semiconductor but has a significantly bigger band gap than, say, InSb, and therefore it can act as an insulating material in such a context. More generally this substrate material could be any insulator, e.g. GaAs, GaSb or Si. In embodiments the substrate material 11 is monocrystalline. In embodiments the crystalline structure of the substrate material is a zincblende structure (named after the crystal lattice structure found in the mineral zincblende, though this does not imply the use of the mineral zincblende itself nor the presence of zinc).

At step S2, the method comprises adding a first layer of mask material 12, e.g. silicon nitride, silicon oxide, aluminium oxide, hafnium oxide or boron nitride. The mask material is amorphous (i.e. non crystalline) as it will provide the mask for a subsequent selective area growth (SAG) step.

At step S3, the method comprises patterning the mask material of the first layer 12. In embodiments this may comprise etching away parts of the mask to leave openings. In a particularly efficient implementation, the etching is allowed to go down through the mask material 12 and part way down into the substrate 11, thus, in one etching step, also forming trenches in the substrate 11 that are coincident with the openings in the first mask 12 in the plane of the substrate 11. It is these openings and trenches in which the gates 13 will be formed. The etching may be performed for example using lithographic techniques (such as electron beam lithography) or a stencil mask.

In alternative implementations however, it is not essential to form the trenches and openings in the same etching step. For example, the trenches could be formed in a first etching step and then the first mask material 12 could be applied subsequently and then patterned by, e.g., lithography.

Either way, the openings in the first mask 12 are coincident with the trenches in the substrate 11 in the plane of the substrate. The substrate 11 is formed from a crystalline material, or at least the upper-facing surfaces at the bottom of the trenches are crystalline.

At step S4 the gate material 13 is formed in the trenches through the openings in the first mask 12. This is performed using selective area growth (SAG), with the surface at the pits of the trenches in the substrate 11 acting as the seed crystal for epitaxial growth of the gate material 13. As such the gate material 13 is chosen to be crystalline also. Furthermore, the gate material 13 is monocrystalline in order to support epitaxial growth of the nanowires thereover. Conventionally gates are formed by sputtering or evaporating metals that are polycrystalline when evaporated or sputtered. Furthermore, the dielectric necessary to electrically insulate the bottom gates is usually amorphous. However, to form in-plane nanowires over bottom gates, a single crystalline layer will be required to grow upon, in order to minimize defects in your in-plane wire. Hence the presently disclosed techniques form monocrystalline material by selective area growth. In embodiments the gate material 13 has a zincblende crystal structure to provide good crystal matching with the substrate material 11 on which it is grown. However other suitably matched crystal combinations are possible. The gate material 13 is conducting. The gate material 13 may be a non-metal. For instance, in embodiments the gate material 13 is a doped semiconductor such as doped InGaAs (indium gallium arsenide) or doped InP (indium phosphide), doped to a sufficient degree so as to act as a conductor for the purpose of gating. By doping, the fermi level is shifted into the conduction/valence band depending on the dopant making the material conducting. Preferably the substrate 11 (or at least the upper surface thereof) is a dielectric or other insulator, and in embodiments also has a larger bandgap than the semiconductor 16 of the nanowires. Thus the substrate isolates the gates from one another.

In embodiments the gates 13 are formed up to a level that is flush with the upper surface of the substrate 11, so as to provide a flat surface to be worked in subsequent steps. However this is not absolutely essential. In embodiments the width of the openings in the first mask 12 and the trenches in the substrate 11, and therefore the width of the gates 13, is between 20 nm and 100 nm. They are as long as desired for the length of the gates 13 in the design for the application in question. There is no strict limit on the width of the gates 13, though after about 100 nm the quality of the growth may start to be affected. The depth of the gate 13 may be between about 10 nm and 100 nm. In principle the gate can be any depth, but increasing the width will make it more difficult to align the gate height with the substrate.

At step S5 the method comprises removing the first mask 12. This may be performed using any suitable known chemical processing step. Note that at this stage there are no nanowires yet formed which could be damaged by the chemical processing.

At step S6, the method comprises forming a second layer of mask material 14. This could be formed for example from any of the possible materials as discussed in relation to the first mask 12. At step S7, the method comprises patterning the second mask 14 to form openings through the second mask. These openings may not be coincident with the first openings or gates 13, but they do partially overlap. The openings in the second mask define where the semiconductor 16 cores of the nanowires will be formed. These openings may again be formed by any suitable known lithographic approach, for example.

At step S8, the method comprises forming a buffer 15 in the openings in the second mask 14. In embodiments this is performed by SAG. However other deposition techniques are not excluded for this step. The buffer 15 is both insulating and crystalline, preferably monocrystalline. It is insulating so as to electrically isolate the gates 13 from the nanowires 16/17 (so it has a larger bandgap than the semiconductor 16). The electrostatic field can penetrate from the gate 13 to the nanowire core 16, but there is no electric contact. In embodiments the buffer 15 is a dielectric. It also comprises a crystalline material so as to act as a seed crystal base for the semiconductor 16 of the nanowires to be formed in the next step. In embodiments the buffer 15 is formed form a single buffer material that is both insulating and crystalline, but a two-layer buffer with a lower insulating layer and upper crystalline layer is not excluded. In embodiments the crystalline buffer material 15 has a zincblende crystal structure to provide good crystal matching with the zincblende gates material 13 on which it is grown, and with the semiconductor 16 (which may also have zincblende structure) to be grown on the buffer 15. Examples of a suitable single material for use as a buffer 15 include InAlSb (indium aluminium antimonide) or InP. However other suitable crystal matchings are possible.

At step S9 the method comprises growing the semiconductor 16 of the nanowires, on the buffer 15, in the openings in the second mask 14, thus forming a network of nanowire cores. This is again performed by SAG. Based on this approach, it is possible to lithographically define practically any structure of nanowire network the designer wishes, which is not possible using the out-of-plane nanowire approach. The pattern of the nanowires is also arranged so is to at least partially intersect with the underlying gates 13 in the plane of the substrate (but do not make electrical contact in the z direction). This enables the device to be used to choose specifically where to gate the nanowire network and where not. For instance, in the illustrated example the gates 13 are formed as long, thin lines—so called "finger gates"—and a nanowire 16/17 is formed perpendicular to the ginger gates 13.

In embodiments the width of the openings in the second mask 14, and therefore the width of the nanowires cores 16, is between 20 nm and 100 nm. They can be as long as desired for the design of the application in question. There is no strict limit on the width, but after about 100 nm the effect of 1D confinement for forming MZMs starts to diminish.

The semiconductor material 16 of the nanowires is crystalline, preferably monocrystalline. In embodiments the semiconductor 16 of the nanowires is a iii-v semiconductor, e.g. InSb, InAs, InP or GaAs. In an alternative example it could be silicon (Si). In embodiments the semiconductor 16 used for the nanowires has a zincblende crystal structure in order to provide good crystal matching with the buffer 15 on which it is grown. However other suitably matched crystal structures are possible. The semiconductor 16 of the nanowires also has a smaller bandgap than any insulators or dielectrics used for such properties elsewhere in the device, such as the substrate 11 or buffer 15.

Figure 4:
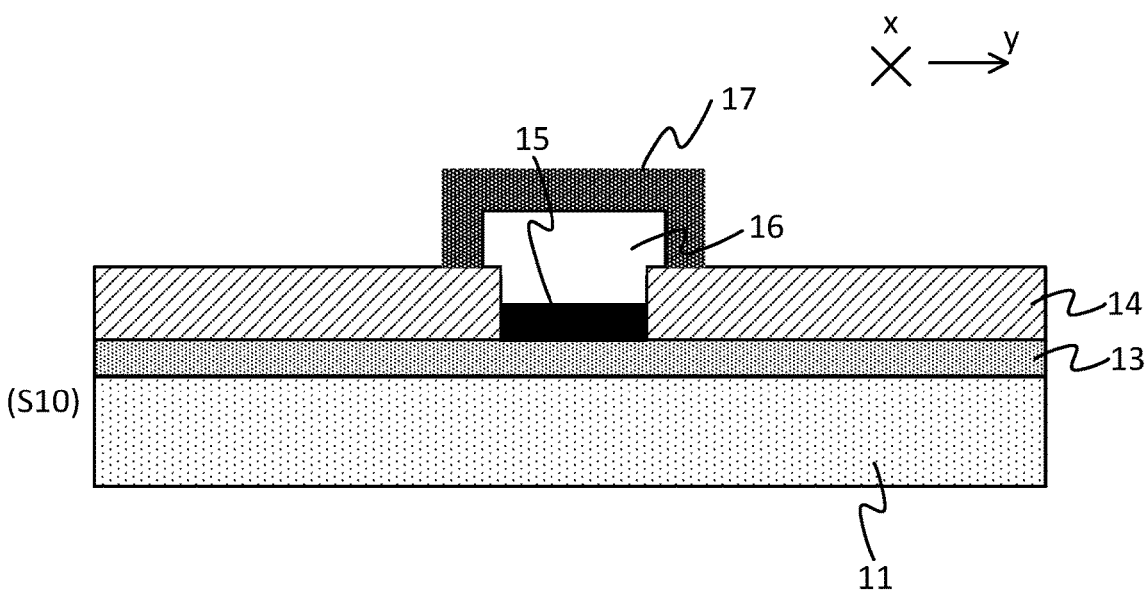
FIG. 4 is a schematic side view illustrating the formation of a superconducting coating on the device.

At step S10 the superconducting coating 17 is formed over at least part of each nanowire core 16. This is also shown schematically in FIG. 4, which shows the same orientation as FIG. 2B (x into the page). The superconductor 17 may be formed all the way around the upper perimeter of the semiconductor core 16 (all facets left exposed at step S9), as shown in FIG. 4; or it may be formed only part of the way around (e.g. when formed by angled deposition if may only coat one or two facets). It may be formed all the way along the length of the nanowire (into the page) or only part of the way. Any superconducting material could be used, e.g. Al, Pb, Sn or Nb.

It will be appreciated that the above embodiments have been described by way of example only.

More generally, according to one aspect disclosed herein, there is provided a method of fabricating a device comprising a plurality of semiconductor-superconductor nanowires, each comprising a respective semiconductor core and a coating of superconductor material over the respective core; the method comprising: forming a first mask over a substrate, the substrate defining a plane, wherein the first mask is formed from an amorphous material and has a pattern of first openings formed over trenches in the substrate, and the substrate comprises a crystalline material at least at a surface of the trenches; forming a monocrystalline conducting material in the first openings by selective area growth, in order to thereby form gates for the nanowires in the trenches of the substrate; forming a second mask over the substrate and gates, the second mask also being amorphous and having a pattern of second openings; forming an insulating crystalline buffer in the second openings; forming a crystalline semiconductor material on the buffer in the second openings by selective area growth in order to form the cores of the nanowires, wherein the gates intersect with the cores in the plane of the substrate; and forming the coating of superconductor material over at least part of each of the cores.

In embodiments, the forming of the first mask may be performed by: forming a layer of mask material over the substrate, and etching the first openings and trenches in the same etching step.

In embodiments the semiconductor material may have a zincblende crystal structure.

In embodiments the semiconductor material may be a iii-v semiconductor.

In embodiments, the semiconductor material may be one of InSb, InAs, InP, GaAs, or Silicon.

In embodiments, the conducting material of the gates may have a zincblende crystal structure.

In embodiments, the conducting material of the gates may comprise a doped semiconductor.

In embodiments the conducting material of the gates may be doped InGaAs or doped InP.

In embodiments the substrate may be a dielectric or other insulator.

In embodiments, the substrate has a zincblende crystal structure at least where the gates are formed.

In embodiments the substrate comprises at least an upper layer of crystalline material in which the trenches are formed.

In embodiments said crystalline material of the substrate may have a zincblende crystal structure.

In embodiments, the substrate may be formed of InP, GaAs, GaSb or Si.

In embodiments, the buffer may also be formed by selective area growth through the second openings in the second mask.

In embodiments, the buffer may have a zincblende crystal structure.

In embodiments the buffer may be InAlSb or InP.

In embodiments the superconductor may be Al, Pb, Sn or Nb.

In embodiments the first and/or second masks may be dielectrics or other insulators.

In embodiments, the first and/or second masks may be formed from any of: silicon nitride, silicon oxide, aluminium oxide, hafnium oxide or boron nitride.

According to another aspect of the present disclosure, there is provided a device fabricated by the method of embodiment disclosed herein.

According to another aspect there is provided a method of operating the device, this method comprising: cooling the device to a temperature where the superconductor becomes superconducting, applying a magnetic field from an internal or external source, and applying an electrostatic potential to the gates in order to induce majorana zero modes in at least some of the nanowires.

Other variants or use cases of the disclosed techniques may become apparent to the person skilled in the art once given the disclosure herein. The scope of the disclosure is not limited by the described embodiments but only by the accompanying claims.

The invention claimed is:

1. A method of fabricating a device comprising a plurality of semiconductor-superconductor nanowires, each comprising a respective semiconductor core and a coating of superconductor material over the respective core; the method comprising:
   forming a first mask over a substrate, the substrate defining a plane, wherein the first mask is formed from an amorphous material and has a pattern of first openings formed over trenches in the substrate, and the substrate comprises a crystalline material at least at a surface of the trenches;
   forming a monocrystalline conducting material in the first openings by selective area growth, in order to thereby form gates for the nanowires in the trenches of the substrate;
   forming a second mask over the substrate and gates, the second mask also being amorphous and having a pattern of second openings;
   forming an insulating crystalline buffer in the second openings;
   forming a crystalline semiconductor material on the buffer in the second openings by selective area growth in order to form the cores of the nanowires, wherein the gates intersect with the cores in the plane of the substrate; and
   forming the coating of superconductor material over at least part of each of the cores.

2. The method of claim 1, wherein the forming of the first mask is performed by: forming a layer of mask material over the substrate, and etching the first openings and trenches in the same etching step.

3. The method of claim 1, wherein the semiconductor material has a zincblende crystal structure.

4. The method of claim 1, wherein the semiconductor material is a iii-v semiconductor.

5. The method of claim 1, wherein the semiconductor material is one of InSb, InAs, InP, GaAs, or Silicon.

6. The method of claim 1, wherein the conducting material of the gates has a zincblende crystal structure.

7. The method of claim 1, wherein the conducting material of the gates comprises a doped semiconductor.

8. The method of claim 7, wherein the conducting material of the gates is doped InGaAs or doped InP.

9. The method of claim 1, wherein the substrate is a dielectric or other insulator.

10. The method of claim 1, wherein the substrate comprises at least an upper layer of crystalline material in which said trenches are formed.

11. The method of claim 10, wherein said material of the substrate has a zincblende crystal structure.

12. The method of claim 1, wherein the substrate is InP, GaAs, GaSb or Si.

13. The method of claim 1, wherein the buffer is also formed by selective area growth through the second openings in the second mask.

14. The method of claim 1, wherein the buffer has a zincblende crystal structure.

15. The method of claim 1, wherein the buffer is InAl Sb or InP.

16. The method of claim 1, wherein the superconductor is Al, Pb, Sn or Nb.

17. The method of claim 1, wherein the first and/or second masks are dielectrics or other insulators.

18. The method of claim 1, wherein the first and/or second masks are formed from any of: silicon nitride, silicon oxide, aluminium oxide, hafnium oxide or boron nitride.

19. A device fabricated by the method of claim 1.

20. A method of operating the device of claim 19, comprising:
   cooling the device to a temperature where the superconductor becomes superconducting,
   applying a magnetic field from an internal or external source, and
   applying an electrostatic potential to the gates in order to induce majorana zero modes in at least some of the nanowires.

* * * * *